United States Patent
Takemoto

(10) Patent No.: US 7,372,288 B2
(45) Date of Patent: May 13, 2008

(54) TEST APPARATUS FOR TESTING MULTIPLE ELECTRONIC DEVICES

(75) Inventor: Hiroshi Takemoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 16 days.

(21) Appl. No.: 11/447,679

(22) Filed: Jun. 6, 2006

(65) Prior Publication Data

US 2006/0273818 A1 Dec. 7, 2006

(30) Foreign Application Priority Data

Jun. 7, 2005 (JP) ............................ 2005-167186

(51) Int. Cl.
| | |
|---|---|
| G01R 31/26 | (2006.01) |
| H03K 17/16 | (2006.01) |
| H01R 13/66 | (2006.01) |
| H03P 5/04 | (2006.01) |

(52) U.S. Cl. .................. 324/765; 326/30; 439/620.04; 333/24 R

(58) Field of Classification Search ................ 324/765; 326/30; 439/620.04; 333/24 R
See application file for complete search history.

(56) References Cited

U.S. PATENT DOCUMENTS

| | | | | |
|---|---|---|---|---|
| 5,086,271 A | * | 2/1992 | Haill et al. ............... | 324/158.1 |
| 5,087,900 A | * | 2/1992 | Birchak et al. ............. | 333/100 |
| 5,107,205 A | * | 4/1992 | Ebihara ...................... | 714/740 |
| 5,107,230 A | * | 4/1992 | King ............................ | 326/86 |
| 5,523,703 A | * | 6/1996 | Yamamoto et al. ........... | 326/30 |
| 6,255,843 B1 | * | 7/2001 | Kurihara ..................... | 324/765 |
| 6,275,023 B1 | * | 8/2001 | Oosaki et al. ............ | 324/158.1 |
| 6,404,220 B1 | * | 6/2002 | Hashimoto ................... | 324/765 |
| 6,476,628 B1 | * | 11/2002 | LeColst ...................... | 324/765 |
| 6,779,140 B2 | * | 8/2004 | Krech et al. ................ | 714/718 |
| 6,856,158 B2 | * | 2/2005 | Frame et al. ............... | 324/765 |
| 7,013,230 B2 | * | 3/2006 | Sekino ........................ | 702/117 |
| 7,171,598 B2 | * | 1/2007 | Cullen et al. ............... | 714/724 |
| 2001/0033182 A1 | * | 10/2001 | Uehara ........................ | 324/765 |
| 2006/0044008 A1 | * | 3/2006 | Miyake et al. ................ | 326/30 |
| 2006/0152234 A1 | * | 7/2006 | Miller ......................... | 324/754 |

* cited by examiner

Primary Examiner—Benny Q. Tieu
Assistant Examiner—Karen M Kusumakar
(74) Attorney, Agent, or Firm—Osha Liang LLP

(57) ABSTRACT

There is disclosed a test apparatus including a driver that outputs a test signal, a first switch that is provided between the driver and a terminal of the first device under test, a second switch that is provided between the driver and a terminal of the second device under test, a first termination resistor that terminates the output signal from the driver in the terminal of the first device under test, a second termination resistor that terminates the output signal from the driver in the terminal of the second device under test, and a substitute resistor that is decoupled from the driver when the driver is connected to the terminals of the first and second device under test, and is connected to the driver when the driver and the terminal of the second device under test are disconnected.

6 Claims, 4 Drawing Sheets

TEST APPARATUS FOR TESTING MULTIPLE ELECTRONIC DEVICES

CROSS REFERENCE TO RELATED APPLICATION

The present application relates to and claims priority from a Japanese Patent Application No. 2005-167186 filed on Jun. 7, 2005, the contents of which are incorporated herein by reference.

BACKGROUND OF THE INVENTION

1. Field of the Invention

The present invention relates to a test apparatus. More particularly, the present invention relates to a test apparatus that supplies a test signal to a plurality of terminals in common.

2. Related Art

Conventionally, a test apparatus for testing a device under test such as an IC or an LSI has input a test signal output from one driver into a plurality of devices under test in order to test more devices under test by means of a few hardware resources. FIG. 4 is a view showing a configuration of a motherboard 450 and a probe card 455 in such a test apparatus.

The driver 440 is provided in a test module inserted in a test head of the test apparatus, and outputs a common test signal based on a test pattern to test a device under test 50a and a device under test 50b to the device under test 50a and the device under test 50b.

The motherboard 450 is also referred to as a performance board. The motherboard 450 is installed on the test head of the test apparatus, and transmits a test signal from the driver 440 to the probe card 455 via a transmission channel 460. The probe card 455 is mounted on the motherboard 450, and inputs the test signal input from the motherboard 450 into terminals of the device under test 50a and the device under test 50b via probe pins.

The probe card 455 includes a switch 470 provided between the driver 440 and the terminal of the device under test 50a, a switch 471 provided between the driver 440 and the terminal of the device under test 50b, a transmission channel 480 for connecting the switch 470 and the terminal of the device under test 50a, and a transmission channel 481 for connecting the switch 471 and the terminal of the device under test 50b. The switches 470 and 471 respectively select whether the driver 440 is connected to the terminal of the device under test 50a and the driver 440 is connected to the terminal of the device under test 50b.

For example, when either of the devices under test 50 is bad as a test result, since this device under test 50 is disconnected from the driver 440, a test for the other device under test 50 can be continued. For example, in a leakage current test for the device under test 50a and the device under test 50b, when a leakage current is detected from the device under test 50b, a leakage current test for the device under test 50a can be continued by disconnecting the terminal of the device under test 50b from the driver 440 by turning off the switch 471.

In addition, since prior art documents are not now recognized, the description related to prior art documents will be omitted.

In the above-described conventional art, in order to raise a quality of a waveform of a test signal supplied to the device under test 50a and the device under test 50b, it is desirable to shorten the transmission channel 480 and the transmission channel 481 and branch a test signal from the driver 440 in the vicinity of the device under test 50a and the device under test 50b. However, the transmission channel 480 and the transmission channel 481 become longer when the switches 470 and 471 such as a relay are provided between the driver 440 and the devices under test 50a and 50b. In this case, since a test signal reflects on a contact portion of the probe card 455 and one of the devices under test 50, a test signal input into the other device under test 50 is disturbed.

For this reason, since a test signal switching at high speed has a significantly deteriorated waveform in the above-described conventional art, it was difficult to supply a high-speed test signal exceeding, e.g., 10 MHz to 30 MHz to a plurality of devices under test.

Moreover, according to the request of multiple pins of the device under test 50 and the increase of the number of the devices under test 50, the number of the necessary switches 470 and 471 increases, and thus it is difficult to mount these switches on the probe card 455. However, when mounting these switches 470 and 471 on the motherboard 450, the transmission channel 480 and the transmission channel 481 become longer similarly to the above, and thus a quality of a waveform of a test signal decreases.

SUMMARY OF THE INVENTION

Therefore, it is an object of the present invention to provide a test apparatus that can solve the foregoing problems. The above and other objects can be achieved by combinations described in the independent claims. The dependent claims define further advantageous and exemplary combinations of the present invention.

According to the first aspect of the present invention, there is provided a test apparatus that tests a first device under test and a second device under test. The test apparatus includes: a pattern generator that generates a common test pattern to be supplied to the first device under test and the second device under test; a signal output section that outputs a test signal based on the test pattern; a first switch that is provided between the signal output section and a terminal of the first device under test and selects whether the signal output section and the terminal of the first device under test are connected to each other; a second switch that is provided between the signal output section and a terminal of the second device under test and selects whether the signal output section and the terminal of the second device under test are connected to each other; a first termination resistor that terminates the output signal from the signal output section between the first switch and the terminal of the first device under test; a second termination resistor that terminates the output signal from the signal output section between the second switch and the terminal of the second device under test; and a substitute resistor that is decoupled from the signal output section when the first switch and the second switch connect the signal output section to the terminal of the first device under test and the terminal of the second device under test and is connected to the signal output section in place of the second termination resistor when the second switch disconnects the signal output section and the terminal of the second device under test.

The substitute resistor may be connected to the signal output section in place of the first termination resistor or the second termination resistor when the first switch disconnects the signal output section from the terminal of the first device under test or when the second switch disconnects the signal output section from the terminal of the second device under test.

The first termination resistor may be connected between electric wiring between the first switch and the terminal of the first device under test and a ground, the second termination resistor may be connected between electric wiring between the second switch and the terminal of the second device under test and a ground, and the test apparatus may further include a switch section for ground that disconnects the first termination resistor and the second termination resistor from the ground when testing a leakage current from the first device under test and the second device under test.

The test apparatus may include a plurality of sets each comprising the signal output section, the first switch, the second switch, the first termination resistor, the second termination resistor, and the substitute resistor, one end of each the first termination resistor may be connected to electric wiring between the corresponding first switch and the first device under test and the other ends may be connected to one another, and the switch section for ground may include a switch for termination provided between the other ends of the plurality of first termination resistors connected to one another and a first ground, a first capacitor for termination provided between electric wiring between the other end of the first termination resistor and the switch for termination and a second ground, and a second capacitor for termination provided between electric wiring between the switch for termination and the first ground and a third ground.

The second capacitor for termination may have an electrostatic capacity larger than that of the first capacitor for termination.

The test apparatus may further include: a deciding section that decides the good or bad of the first device under test and the second device under test based on operations of the first device under test and the second device under test according to the test signal supplied from the signal output section; and a test control section that disconnects the second switch from the signal output section and connects the substitute resistor to the signal output section to test the first device under test when it is decided that the second device under test is bad.

The summary of the invention does not necessarily describe all necessary features of the present invention. The present invention may also be a sub-combination of the features described above.

According to the present invention, it is possible to provide a test apparatus that supplies a high-speed test signal to a plurality of devices.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
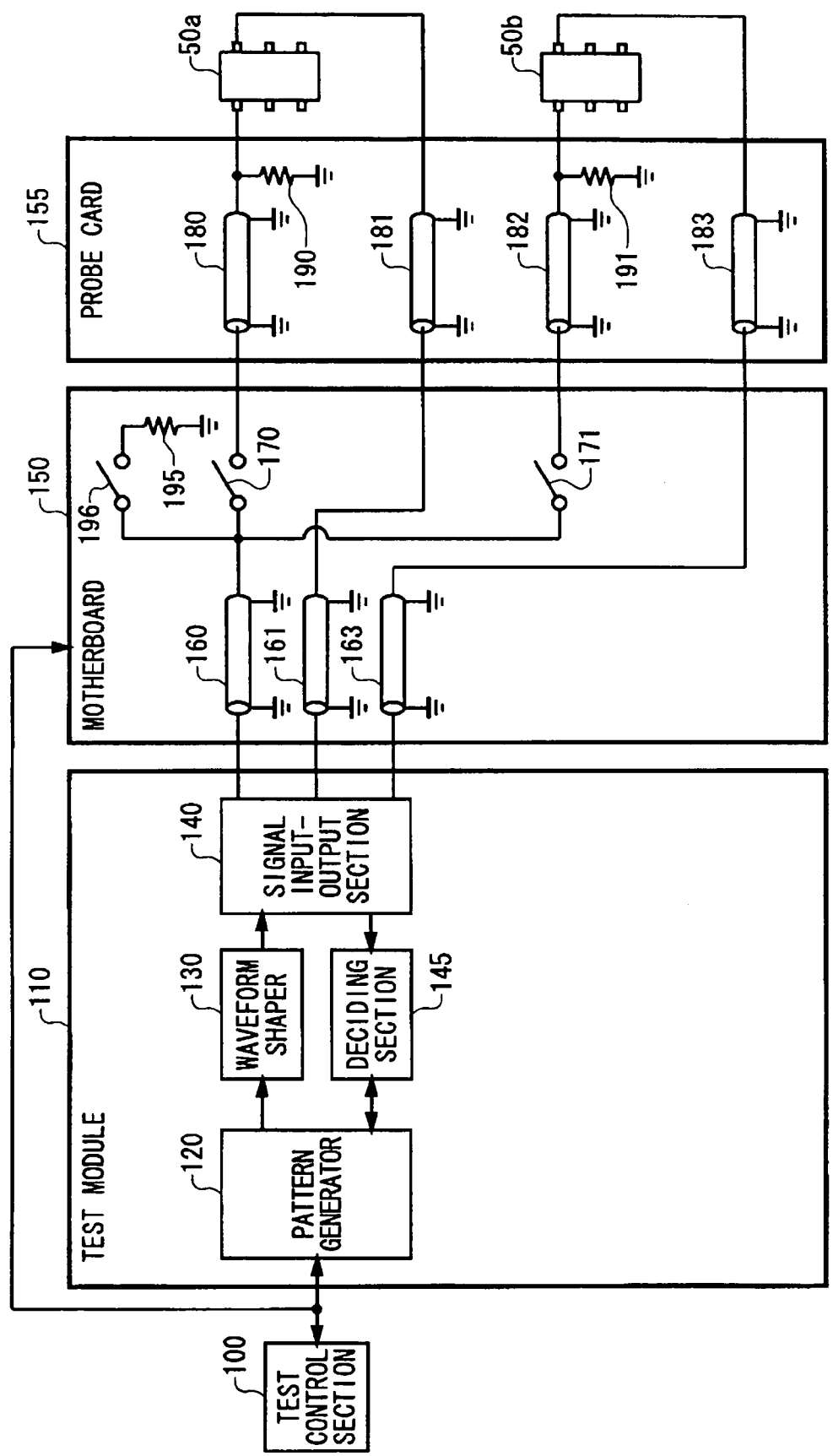
FIG. 1 is a view showing a configuration of a test apparatus according to an embodiment of the present invention.

FIG. 1 is a view showing a configuration of a test apparatus 10 according to the present embodiment. The test apparatus 10 outputs a common test signal to a plurality of devices under test 50 (50a and 50b) to test the plurality of devices under test 50. The test apparatus 10 includes one or a plurality of test modules 110, a motherboard 150, a probe card 155, and a test control section 100.

The test module 110 is inserted into a test head of the test apparatus, and outputs a common test signal to be supplied to the devices under test 50 based on a test pattern to be used for a test of the devices under test 50. The test module 110 has a pattern generator 120, a waveform shaper 130, a signal input-output section 140, and a deciding section 145. Here, the test module 110 may have a plurality of sets each including the pattern generator 120, the waveform shaper 130, the signal input-output section 140, and the deciding section 145, corresponding to a plurality of terminals of the device under test 50.

The pattern generator 120 executes an instruction sequence of a test program based on an instruction of the test control section 100, and generates a common test pattern to be supplied to the device under test 50a and the device under test 50b. The waveform shaper 130 receives and shapes the test pattern, and outputs the shaped pattern to the signal input-output section 140 at a timing designated by the test pattern. In this way, the waveform shaper 130 generates a waveform designated by this test pattern at a timing being designated by this test pattern. The signal input-output section 140 is an example of a signal output section according to the present invention, and outputs a test signal based on the test pattern shaped by the waveform shaper 130 to the device under test 50a and the device under test 50b via the motherboard 150 and the probe card 155.

The deciding section 145 decides the good or bad of the device under test 50 aand the device under test 50b based on operations of the device under test 50a and the device under test 50b according to the test signal supplied from the signal input-output section 140. That is to say, the deciding section 145 may decide that this device under test 50 is bad when an output signal output from the device under test 50 according to the test signal is different from an expected value. Moreover, in case of testing a leakage current from the device under test 50, the deciding section 145 may decide that this device under test 50 is bad when the leakage current flowing from the signal input-output section 140 to a terminal of the device under test 50 is not less than a predetermined value.

The motherboard 150 is installed on a test head of the test apparatus 10, and transmits a test signal from the test module 110 to the probe card 155. The motherboard 150 has a transmission channel 160, a transmission channel 161, a transmission channel 163, a switch 170, a switch 171, a substitute resistor 195, and a switch 196. The probe card 155 is mounted on the motherboard 150, and inputs the test signal input from the motherboard 150 to terminals of the devices under test 50a and 50b via probe pins. The probe card 155 has a transmission channel 180, a transmission channel 181, a transmission channel 182, a transmission channel 183, a termination resistor 190, and a termination resistor 191.

The transmission channel 160 transmits the test signal output from a driver within the signal input-output section 140 to one end of each of the switch 170, the switch 171, and the switch 196. The switch 170 is an example of a first switch according to the present invention, and is provided between the driver within the signal input-output section 140 and the terminal of the device under test 50*a* and selects whether the signal input-output section 140 is connected to the terminal of the device under test 50*a*. The transmission channel 180 is connected to the other end of the switch 170, which is located at a side opposite to the transmission channel 160, and supplies the test signal received through the transmission channel 160 and the switch 170 to the terminal of the device under test 50*a*.

The termination resistor 190 is an example of a first termination resistor according to the present invention, and is provided in the vicinity of the terminal of the device under test 50*a* and terminates an output signal from the signal input-output section 140 between the switch 170 and the terminal of the device under test 50*a*. The termination resistor 190 according to the present embodiment is connected between electric wiring between the switch 170 and the terminal of the device under test 50*a* and a ground. Here, the termination resistor 190 may have a general termination resistance value such as 50 Ω. Alternatively, the termination resistor 190 may reduce reflection in a terminal portion as a higher resistance value such as 200-300 Ω according to drive power of the driver within the signal input-output section 140. Here, the test apparatus 10 may have a switch in series with the termination resistor 190, connect the termination resistor 190 to a ground by turning on this switch in a normal test, and disconnect the termination resistor 190 from the ground by turning off this switch in a leakage current test.

The transmission channel 181 and the transmission channel 161 supplies a signal output from the terminal of the device under test 50*a* to the signal input-output section 140.

The switch 171, the transmission channel 182, the termination resistor 191, and the transmission channel 183 are provided corresponding to the device under test 50*b*, and have the same function and configuration as those of the switch 170, the transmission channel 180, the termination resistor 190, and the transmission channel 181 as described above. That is, the switch 171 is an example of a second switch of the present invention, and is provided between the driver within the signal input-output section 140 and the terminal of the device under test 50*b* and selects whether the signal input-output section 140 is connected to the terminal of the device under test 50*b*. The transmission channel 182 is connected to the other end of the switch 171, which is located at a side opposite to the transmission channel 160, and supplies a test signal received through the transmission channel 160 and the switch 171 to the terminal of the device under test 50*b*.

The termination resistor 191 is an example of a second termination resistor according to the present invention, and is provided in the vicinity of the terminal of the device under test 50*b* and terminates an output signal from the signal input-output section 140 between the switch 171 and the terminal of the device under test 50*b*. The termination resistor 191 according to the present embodiment is connected between electric wiring between the switch 171 and the terminal of the device under test 50*b* and a ground.

The transmission channel 183 and the transmission channel 163 supply a signal output from the terminal of the device under test 50*b* to the signal input-output section 140.

When the switch 171 disconnects the signal input-output section 140 from the terminal of the device under test 50*b*, the substitute resistor 195 is connected to the signal input-output section 140 in place of the termination resistor 191. Moreover, the substitute resistor 195 according to the present embodiment is used as a substitute of the termination resistor 190, and is connected to the signal input-output section 140 in place of the termination resistor 190 when the switch 170 disconnects the signal input-output section 140 from the terminal of the device under test 50*a*. Alternatively, the substitute resistor 195 may be individually provided corresponding to the termination resistor 190 and the termination resistor 191.

Here, it is preferable that the substitute resistor 195 has the substantially same resistance value as that of the termination resistor 190 and the termination resistor 191. In this way, when a common test signal is supplied to the devices under test 50*a* and 50*b* or when a test signal is supplied to the other device under test 50 by disconnecting either of the devices under test 50, the test apparatus 10 can substantially identically hold a load for the driver of the signal input-output section 140 and can supply the substantially same waveform of test signal to the device under test 50 regardless of the number of terminals of the device under test 50 connected to the signal input-output section 140.

The switch 196 is provided between an end of the transmission channel 160, which is located at a side opposite to the signal input-output section 140, and the substitute resistor 195, and selects whether the substitute resistor 195 is connected to this end. When the switch 170 connects the signal input-output section 140 and the terminal of the device under test 50*a* and the switch 171 connects the signal input-output section 140 and the terminal of the device under test 50*b*, the switch 196 disconnects the substitute resistor 195 from the signal input-output section 140. On the other hand, when one side of the switch 170 and the switch 171 disconnects the signal input-output section 140 from the terminal of the device under test 50, the substitute resistor 195 is connected to the signal input-output section 140 in place of the termination resistor 190 or the termination resistor 191 corresponding to the disconnected device under test 50.

The test control section 100 controls a test for the devices under test 50*a* and 50*b*. That is, the test control section 100 first connects the corresponding terminals of the devices under test 50*a* and 50*b* to the signal input-output section 140 by turning on the switch 170 and the switch 171 and turning off the switch 196. Then, the test control section 100 outputs a test signal based on a test program from the test module 110 and supplies the output signal to the devices under test 50*a* and 50*b* via the motherboard 150 and the probe card 155.

When it is judged that the device under test 50 is bad as a test result, the test control section 100 disconnects the switch 170 or the switch 171 corresponding to the device under test 50 that is bad and connects the substitute resistor 195 to the signal input-output section 140, in order to test the other device under test 50.

According to the test apparatus 10 described above, since the termination resistor 190 and the termination resistor 191 are provided, it is possible to prevent reflection of a test signal waveform on a terminal portion of the device under test 50. In this way, although the transmission channel 180 and the transmission channel 182 are long, it is possible to prevent a test signal waveform reflected from a terminal of one side of the devices under test 50 from interfering with a test signal waveform to be supplied to a terminal of the other device under test 50 to reduce a quality of the test signal waveform. Moreover, it is possible to supply a test signal switching at high speed to the device under test 50 with high quality. Here, in the test apparatus 10 according to the present embodiment, since the transmission channel 180 and the transmission channel 182 become long, it is possible to mount the switch 170 and the switch 171 on the motherboard 150 and thus prevent quality degradation of a test signal waveform according to the request of multiple pins and the increase of the number of devices to be tested at the same time.

Moreover, since the termination resistor 190 and the termination resistor 191 are provided, the termination resistor 190 and the termination resistor 191 can terminate a signal line with respect to a test signal switching at high speed. Moreover, when the switches are respectively provided in series with the termination resistor 190 and the termination resistor 191, it is possible to prevent a current from flowing from a signal line to a ground by turning off this switch in a leakage current test.

Moreover, when the switch 170 or the switch 171 is disconnected, since the substitute resistor 195 connected to the signal input-output section 140 is provided in place of the disconnected termination resistor 190 or termination resistor 191, it is possible to substantially identically hold a load connected to the signal input-output section 140 even if the number of the devices under test 50 to be simultaneously tested is changed. Moreover, since the common substitute resistor 195 is used in place of the termination resistor 190 and the termination resistor 191, it is possible to reduce the number of the switch 196 and the substitute resistor 195 in comparison to when the substitute resistor 195 is individually provided corresponding to each of the termination resistor 190 and the termination resistor 191.

FIGS. 2A to 2D are views exemplary showing a waveform of a test signal by the test apparatus 10 according to the present embodiment.

Figure 2A:
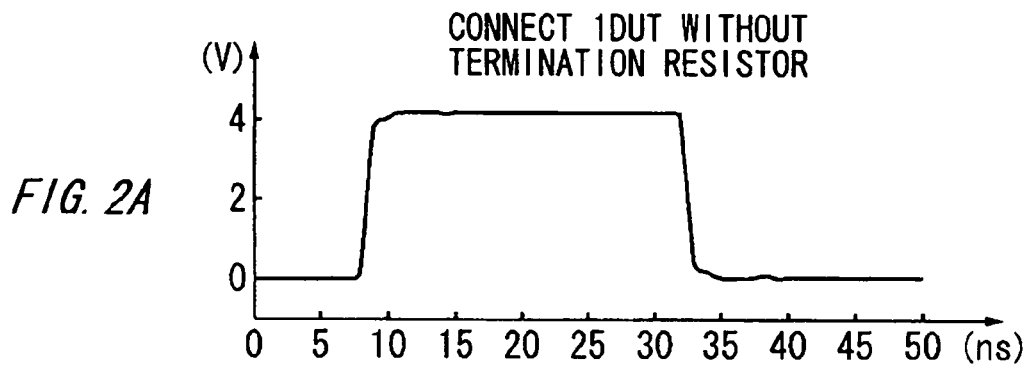
FIGS. 2A to 2D are views exemplary showing a waveform of a test signal by a test apparatus according to an embodiment of the present invention.
Figure 2B:
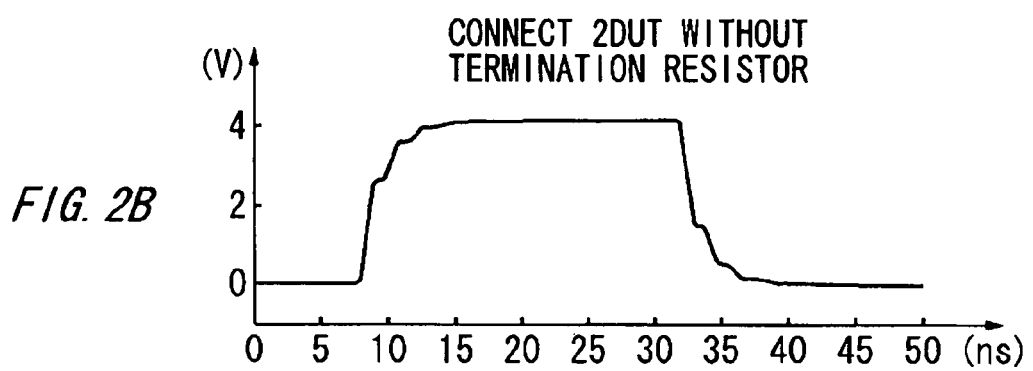

FIG. 2A shows a test signal waveform when the switch 471 is turned off to supply a test signal to the one device under test 50a in a conventional test apparatus not providing the termination resistor 190 and the termination resistor 191. FIG. 2B shows a test signal waveform when the switch 470 and the switch 471 are turned on to supply a test signal to the two devices under test 50 in a conventional test apparatus. As shown in FIGS. 2A and 2B, according to a configuration not providing the termination resistor 190 and the termination resistor 191, when a test signal is supplied to a plurality of devices under test 50, a quality of a signal significantly falls by the reflection of test signal.

Figure 2C:
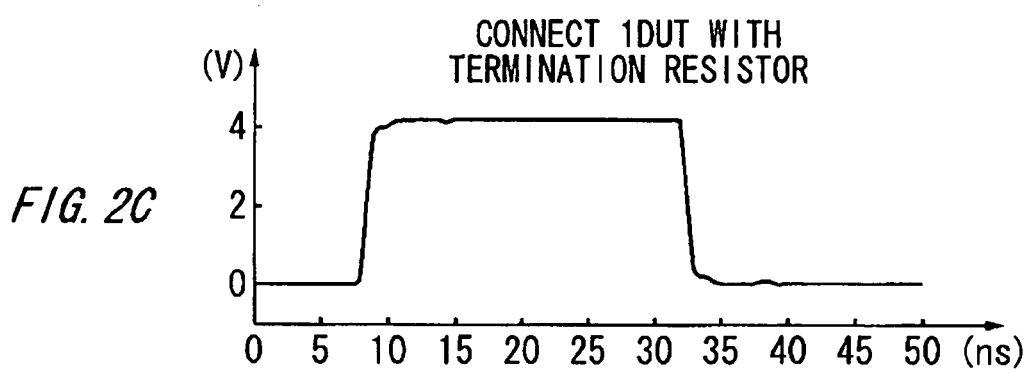
Figure 2D:
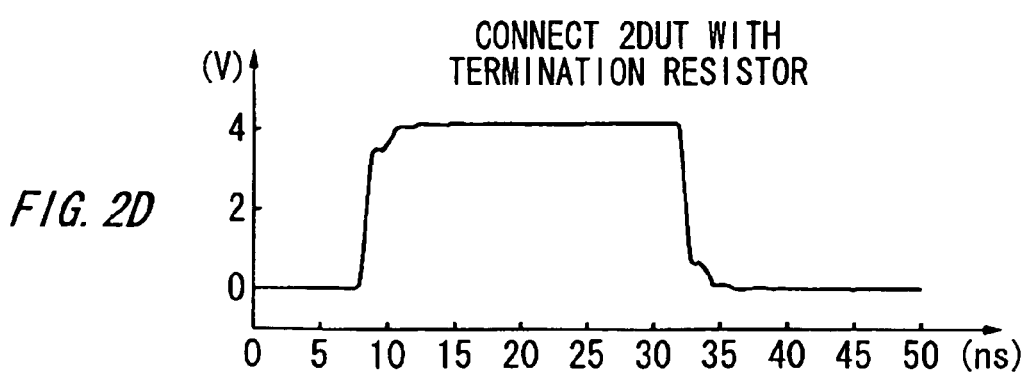

FIG. 2C shows a test signal waveform when the switch 171 is turned off to supply a test signal to the one device under test 50a in the test apparatus 10 according to the present embodiment. FIG. 2D shows a test signal waveform when the switch 170 and the switch 171 are turned on to supply a test signal to the two devices under test 50 in the test apparatus 10 according to the present embodiment. As shown in FIGS. 2C and 2D, according to a configuration providing the termination resistor 190 and the termination resistor 191, it is possible to control quality degradation of a test signal compared with the conventional devices.

Figure 3:
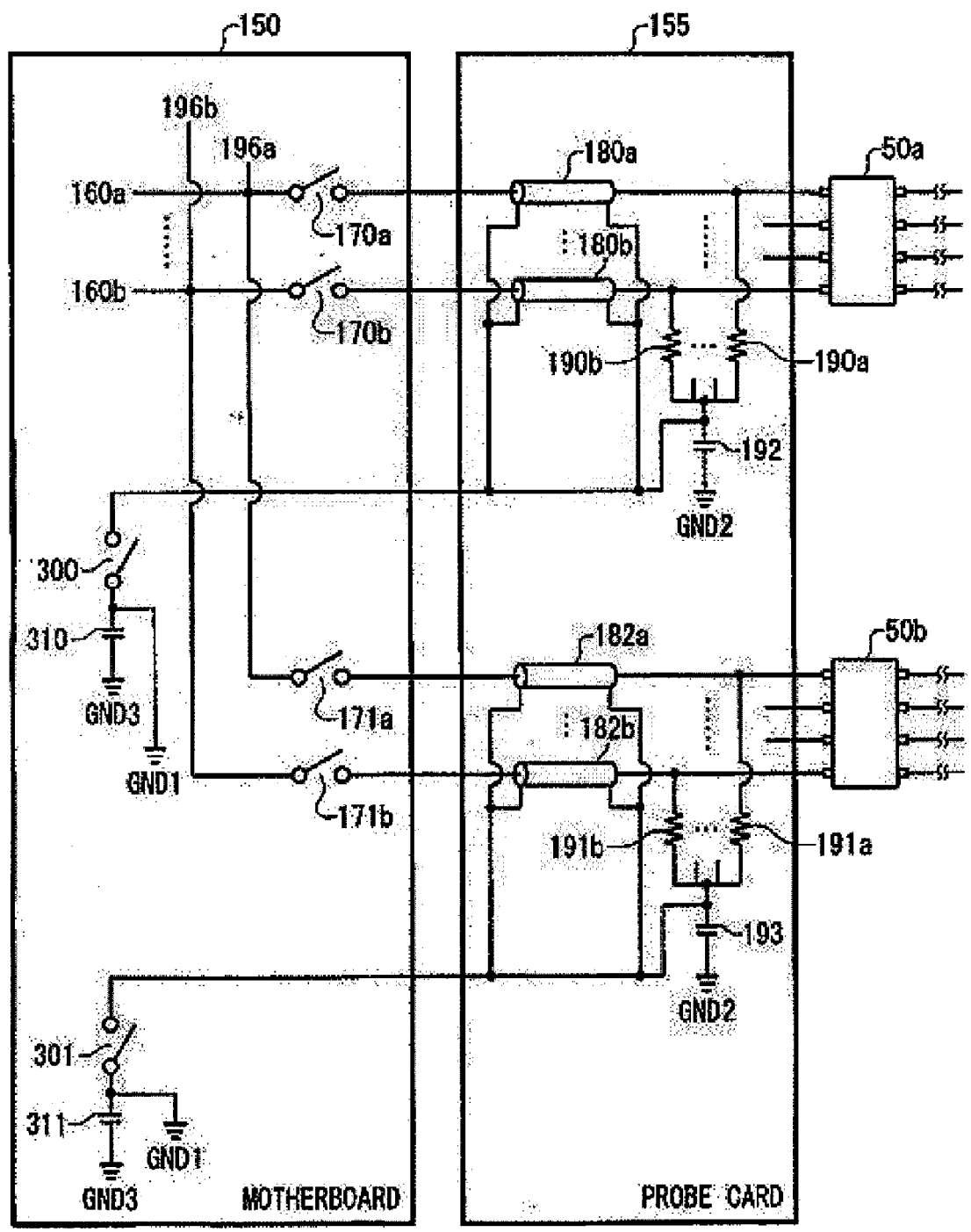
FIG. 3 is a view showing a part of a waveform shaper and a signal input-output section according to an alternative example of an embodiment of the present invention.
Figure 4:
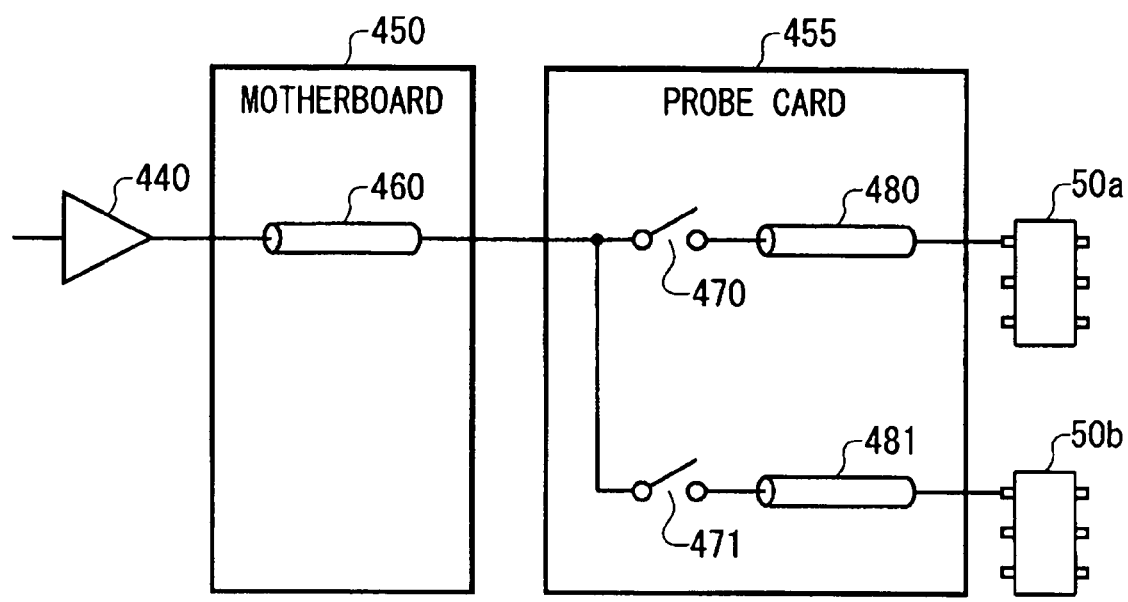
FIG. 4 is a view showing a configuration of a motherboard and a probe card in a conventional test apparatus.

FIG. 3 is a view showing a part of a waveform shaper 130 and a signal input-output section 140 according to an alternative example of the present embodiment. Since the test apparatus 10 according to the present alternative example has a function and a configuration similar to those of FIG. 1 except portions shown in FIG. 3, their descriptions will be omitted except the following point of difference.

The test apparatus 10 according to the present alternative example has a plurality of sets each including a pattern generator 120, a waveform shaper 130, a signal input-output section 140, a deciding section 145, transmission channels 160 (160a and 160b), a substitute resistor 195, and switches 196 (196a and 196b), corresponding to a plurality of terminals of the devices under test 50. Moreover, the test apparatus 10 has a plurality of sets each including switches 170 (170a and 170b), transmission channels 180 (180a and 180b), termination resistors 190 (190a and 190b), a transmission channel 181, and a transmission channel 161, corresponding to a plurality of terminals of the device under test 50a. Similarly, the test apparatus 10 has a plurality of sets each including switches 171 (171a and 171b), transmission channels 182 (182a and 182b), termination resistors 191 (191a and 191b), a transmission channel 181, and a transmission channel 163, corresponding to a plurality of terminals of the device under test 50b.

A capacitor for termination 192, a switch for termination 300, and a capacitor for termination 310 make the termination resistors 190a and 190b function as termination when a test signal is supplied to the device under test 50a, and function as a switch section for ground for disconnecting the termination resistor 190 from a ground when testing a leakage current from the device under test 50a and the device under test 50b. In the present embodiment, one end of each of the plurality of termination resistors 190 is connected to electric wiring between the switches 170 and the terminals of the device under test 50a corresponding to each termination resistor 190, and the other ends are connected to each other. Then, the switch for termination 300 is provided between the other ends of the plurality of termination resistors 190 connected to each other and a first ground GND1. Moreover, the capacitor for termination 192 is provided between electric wiring between the other ends of the plurality of termination resistors 190 and the switch for termination 300 and a second ground GND2. The capacitor for termination 310 is provided between electric wiring between the switch for termination 300 and the first ground GND1 and a third ground GND3. Here, the first ground GND1 may be, e.g., a power source ground connected to a ground of a power source of the test apparatus 10. Moreover, the second ground GND2 may be connected to a normal ground of the probe card 155, and the third ground GND3 may be connected to a normal ground of the motherboard 150. These first to third grounds may be finally connected to the same ground.

Here, the capacitor for termination 310 has electrostatic capacity larger than that of the capacitor for termination 192. That is, electrostatic capacity of the capacitor for termination 192 is set to 200 pF and electrostatic capacity of the capacitor for termination 310 is set to 10 µF. When a test signal is supplied to each terminal of the device under test 50a to perform a normal test, the switch for termination 300 is turned on and thus the plurality of termination resistors 190 and the first ground GND1 are connected to each other. As a result, it is possible to connect the termination resistor 190 to a power source ground that is a standard of the whole test apparatus 10 to supply a ground level, and also reduce voltage fluctuation according to the change of each signal line by the capacitor for termination 192 provided in the vicinity of the termination resistor 190. Moreover, larger voltage fluctuation is reduced by the capacitor for termination 310 and the first ground GND1. Therefore, although the switch section for ground is provided in a lot of terminals such as three or more terminals, it is possible to provide a stable termination function by the termination resistor 190.

On the other hand, in a leakage current test, the capacitor for termination 310 is disconnected from the first ground GND1 and the capacitor for termination 310 by the switch for termination 300. In this way, in a leakage current test, it is possible to reduce electric charges flowing into the capacitor for termination 310 and thus reduce a measurement error of a leakage current. In addition, the test control section 100 may show a user a value obtained by subtracting a current value flowing into the capacitor for termination 192 from a value of the measured leakage current as a leakage current value of the device under test 50*a*.

Since the capacitor for termination 193, the switch for termination 301, and the capacitor for termination 311 have the same function and configuration as those of the capacitor for termination 192, the switch for termination 300, and the capacitor for termination 310 described above, their descriptions will be omitted.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A test apparatus that tests a first device under test and a second device under test, the test apparatus comprising:
    a pattern generator that generates a common test pattern to be supplied to the first device under test and the second device under test;
    a signal output section that outputs a test signal based on the test pattern, said signal output section comprising a driver for outputting the test signal;
    a first switch that is provided between said driver and a terminal of the first device under test and selects whether said driver and the terminal of the first device under test are connected to each other;
    a second switch that is provided between said driver and a terminal of the second device under test and selects whether said driver and the terminal of the second device under test are connected to each other;
    a first termination resistor that terminates the output signal from said driver between said first switch and the terminal of the first device under test;
    a second termination resistor that terminates the output signal from said driver between said second switch and the terminal of the second device under test; and
    a substitute resistor that is decoupled from said driver when said first switch and said second switch connect said driver to the terminal of the first device under test and the terminal of the second device under test and is connected to said driver in place of said second termination resistor when said second switch disconnects said driver and the terminal of the second device under test.

2. The test apparatus as claimed in claim 1, wherein said substitute resistor is connected to said driver in place of said first termination resistor or said second termination resistor when said first switch disconnects said driver from the terminal of the first device under test or when said second switch disconnects said driver from the terminal of the second device under test.

3. The test apparatus as claimed in claim 1, wherein said first termination resistor is connected between electric wiring between said first switch and the terminal of the first device under test and a ground, said second termination resistor is connected between electric wiring between said second switch and the terminal of the second device under test and a ground, and the test apparatus further comprises a switch section for ground that disconnects said first termination resistor and said second termination resistor from the ground when testing a leakage current from the first device under test and the second device under test.

4. The test apparatus as claimed in claim 3, wherein the test apparatus comprises a plurality of sets each comprising said driver, said first switch, said second switch, said first termination resistor, said second termination resistor, and said substitute resistor, one end of each said first termination resistor is connected to electric wiring between said corresponding first switch and the first device under test and the other ends are connected to one another, and said switch section for ground comprises a switch for termination provided between the other ends of said plurality of first termination resistors connected to one another and a first ground, a first capacitor for termination provided between electric wiring between the other end of said first termination resistor and said switch for termination and a second ground, and a second capacitor for termination provided between electric wiring between said switch for termination and the first ground and a third ground.

5. The test apparatus as claimed in claim 4, wherein the second capacitor for termination has an electrostatic capacity larger than that of the first capacitor for termination.

6. The test apparatus as claimed in claim 1, further comprising: a deciding section that decides the good or bad of the first device under test and the second device under test based on operations of the first device under test and the second device under test according to the test signal supplied from said driver; and a test control section that disconnects said second switch from said driver and connects said substitute resistor to said driver to test the first device under test when it is decided that the second device under test is bad.

* * * * *